(12) United States Patent
Moscatelli et al.

(10) Patent No.: US 6,911,699 B2
(45) Date of Patent: Jun. 28, 2005

(54) MOS TRANSISTOR

(75) Inventors: Alessandro Moscatelli, Como (IT);
Giuseppe Croce, Villasanta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 133 days.

(21) Appl. No.: 10/394,422

(22) Filed: Mar. 21, 2003

(65) Prior Publication Data
US 2003/0227037 A1 Dec. 11, 2003

(30) Foreign Application Priority Data

Mar. 22, 2002 (EP) ............................................. 02425179

(51) Int. Cl.[7] .................. H01L 27/01; H01L 27/12; H01L 31/0392
(52) U.S. Cl. .................. 257/351; 257/369; 257/371
(58) Field of Search .................. 257/69, 204, 206, 257/338, 350, 351, 357, 369, 371, 377

(56) References Cited

U.S. PATENT DOCUMENTS 5,973,371 A * 10/1999 Kasai .................. 257/382

* cited by examiner

Primary Examiner—Hoai Pham
(74) Attorney, Agent, or Firm—Lisa K. Jorgenson; Robert Iannucci; Seed IP Law Group PLLC

(57) ABSTRACT

A method for manufacturing a MOS transistor integrated into a chip of semi-conductive material comprising a first and a second active region which extend from the inside of the chip to a surface of the chip. The method comprises the steps of: a) forming a layer of insulating material on the surface of the chip and depositing a layer of conductive material on said insulating layer, b) defining an insulated gate electrode of the transistor, from said superimposed insulating and conductive layers, c) defining, from said superimposed insulating and conductive layers, an additional structure arranged on a first surface portion of the first active region, and d) placing between the insulated gate electrode and the additional structure a dielectric spacer placed on a second surface portion of the first active region.

25 Claims, 10 Drawing Sheets

MOS TRANSISTOR

BACKGROUND OF THE INVENTION

1. Field of the Invention

The present invention refers to a method for manufacturing field-effect metal oxide semiconductor transistors or, more briefly, MOS transistors.

2. Description of the Related Art

As is known, for the manufacture of MOS transistors the CMOS technology can conveniently be used making it possible to produce on the same chip, typically in silicon, both P-channel and N-channel MOS transistors. For example, manufacture of a MOS transistor envisages the provision of an insulated gate electrode on a chip, using photolithographic techniques, including a conductive layer (typically doped polysilicon) deposited on a layer of insulating material (for example, silicon dioxide) and the formation, by means of ionic implantation, of a drain active region and a source active region.

Conventional CMOS technology has the advantage of high integrability and permits fabrication of high speed devices. It should be noted that the use of MOS transistors for high frequency applications is favored by their reduced dimensions, obtained thanks to present-day integration technologies, which make it possible to reduce the internal capacity of said devices (in particular, gate capacity) and, therefore, to raise the cut-off frequencies of said transistors.

Furthermore, conventional MOS transistors may possess high trans-conductance due to reduced thickness of the gate oxide and silicidation of the source and drain active regions and gate polysilicon.

Concerning this, U.S. Pat. No. 6,492,234, which is incorporated by reference herein in its entirety, describes a method of selective silicidation of MOS active regions. The silicidation of a portion of the active region makes it possible to reduce its resistivity.

However, conventional MOS transistors do not provide adequate performance for radio frequency power applications but are suitable only for low power uses. It should be noted that, as a result of this, the power amplifiers used for cellular phone systems are manufactured using other technologies. For example, cell phones which operate in the GSM standard systems (Global System for Mobile Communications) or with the WCDMA (Wideband Division Code Multiple Access) standard, typically use gallium arsenide power amplifiers (GaAsFET).

The use of MOS transistors, such as those that can be obtained by CMOS technology, as power amplifiers is mainly hindered by three disadvantages.

The first disadvantage is represented by the low breakdown voltage between source and drain, BV, of the known MOS transistors which cannot withstand the working voltages typical of power applications.

Furthermore, said MOS transistors are not sufficiently reliable in the face of the phenomenon of injection of hot carriers into the gate oxide.

With reference to the known LDMOS transistors for power applications (Lateral Double diffused MOS), it should be noted that these have the disadvantage of difficult compatibility with the CMOS technology. This type of compatibility is practically an obligatory requirement since it would permit integration on a single chip of transistors used for power amplification and either P or N channel transistors performing logic functions.

BRIEF SUMMARY OF THE INVENTION

An embodiment of the present invention is a method for manufacturing MOS transistors which provide better performance than that of conventional MOS transistors.

One embodiment of the invention is a method for manufacturing a MOS transistor integrated into a chip of semiconductive material. The method includes: forming first and second doped regions that extend from the inside of the chip to a surface of the chip, the first doped region having a first conductivity type and the second doped region having a second conductivity type; forming a layer of insulating material on the surface of the chip and superimposing a layer of conductive material on the insulating layer; defining directly above the second doped region an insulated gate electrode from the superimposed insulating and conductive layers; defining, from the superimposed insulating and conductive layers, an additional structure arranged on a first surface portion of the first doped region; and placing between the insulated gate electrode and the additional structure a dielectric spacer arranged on a second surface portion of the first doped region and on a surface portion of the second doped region.

BRIEF DESCRIPTION OF THE SEVERAL VIEWS OF THE DRAWING(S)

The characteristics and advantages of this invention will be better understood by reading the following detailed description of a non-limiting example of the embodiment, illustrated in the enclosed drawings, where:

Figure 11:
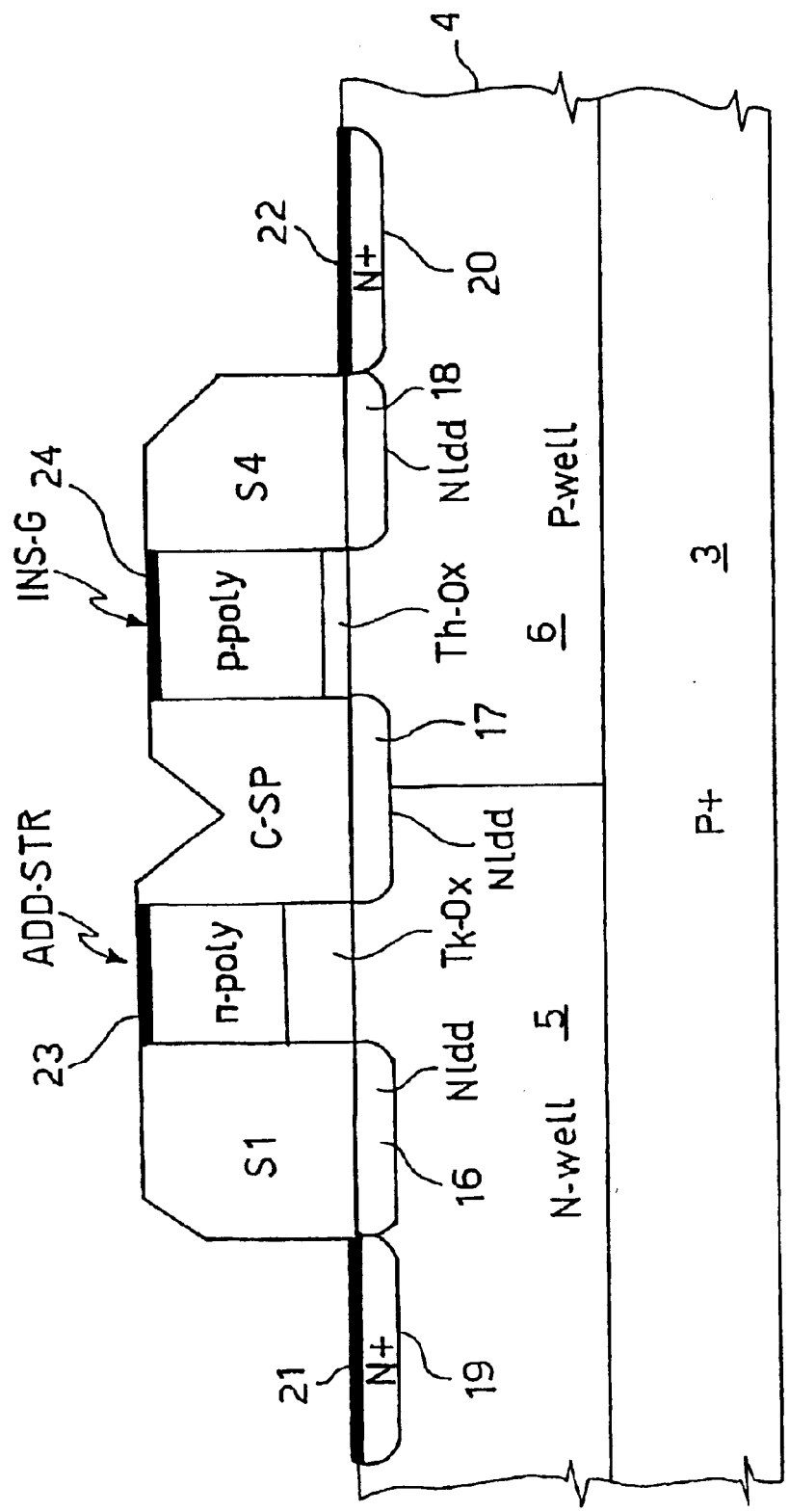
Figure 12:
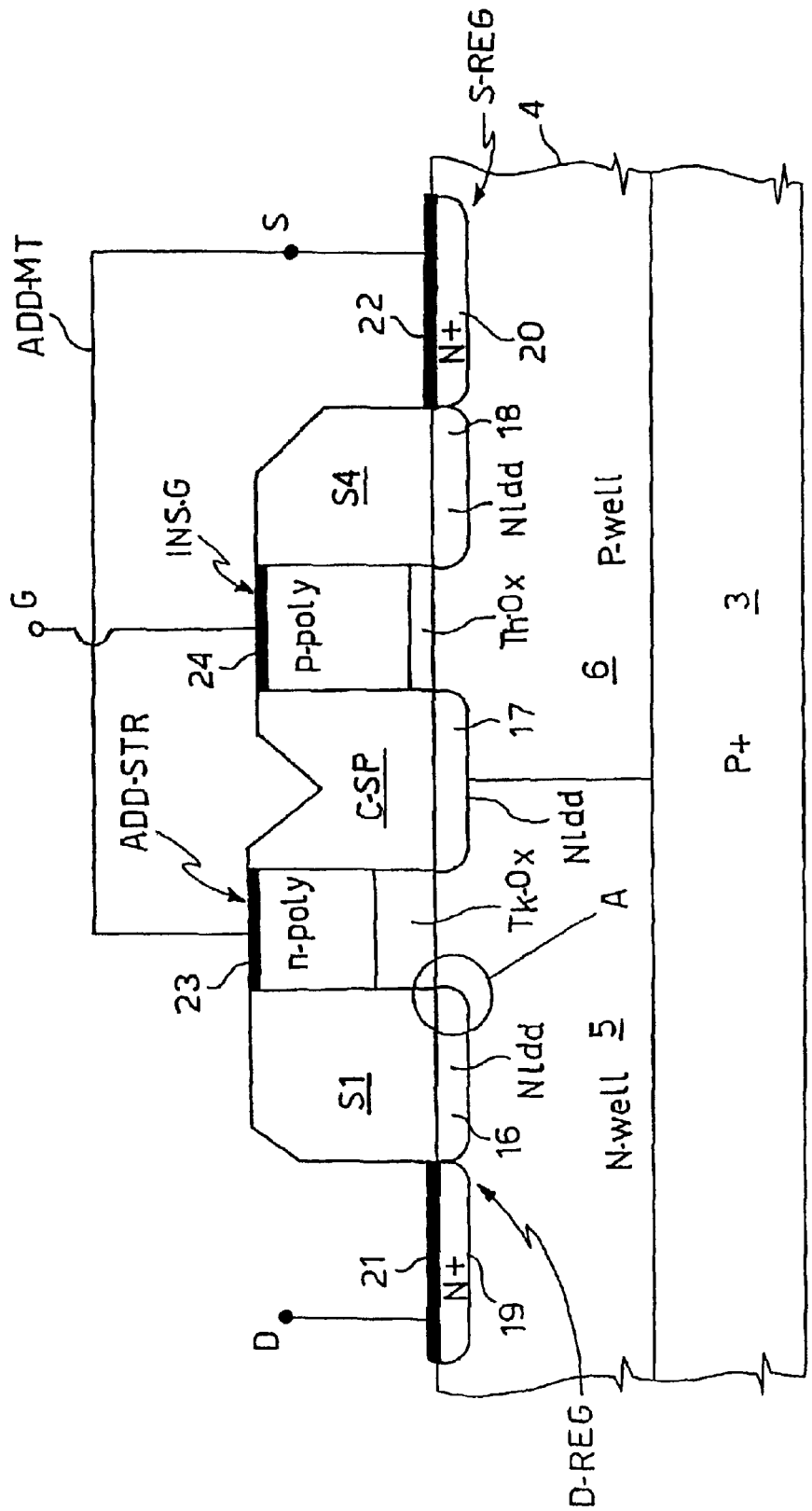
Figure 13:
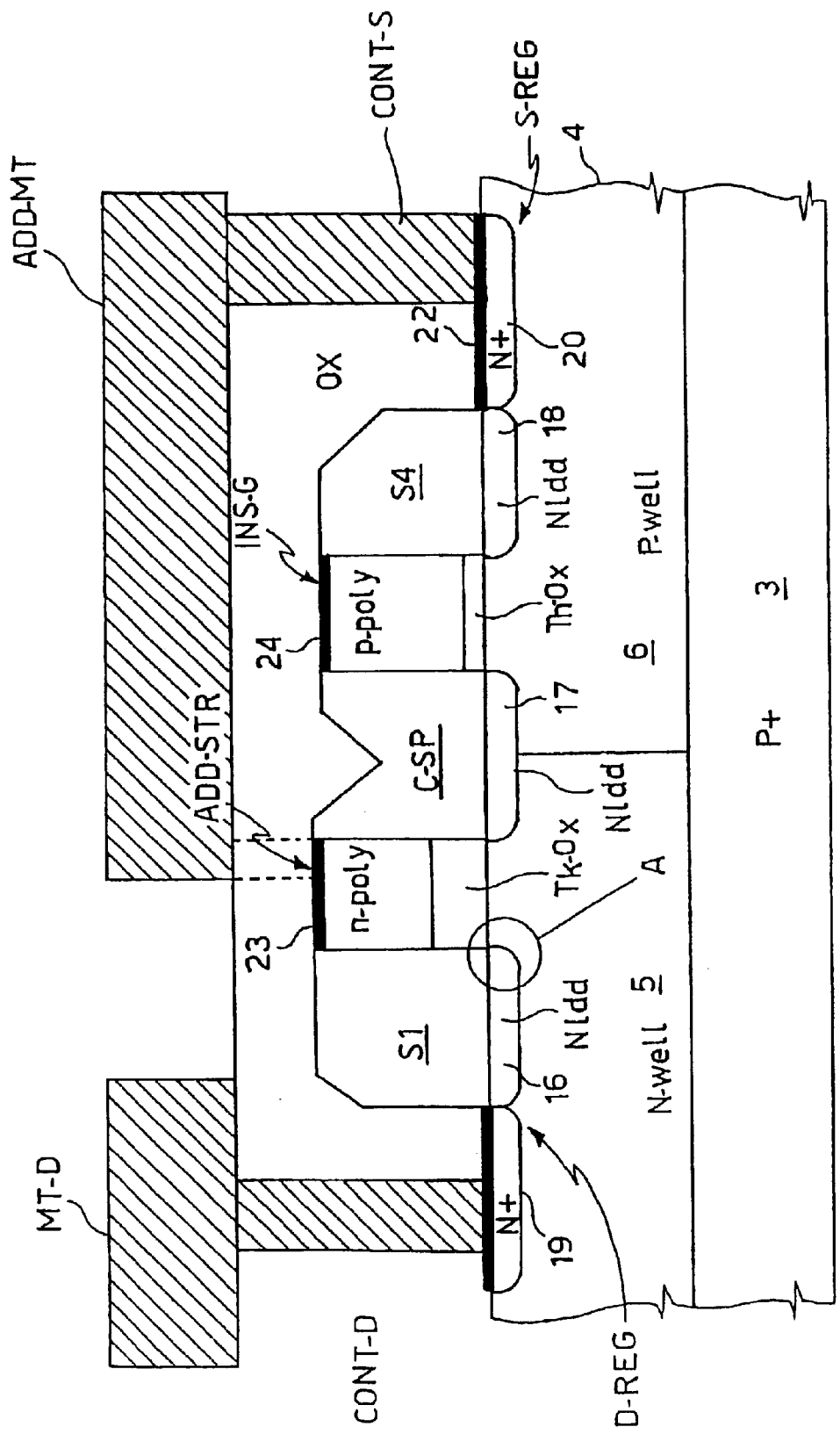

FIG. 11 schematically illustrates said transistor with silicidated regions;

FIGS. 12 and 13 illustrate said transistor including metallization.

DETAILED DESCRIPTION OF THE INVENTION

In the following description, a particular method for manufacturing a MOS transistor integrated into a chip of semi-conductor material 2 is given, according to this invention.

In the drawings to which the following description refers, all identical or similar elements are indicated with the same reference numbers.

Figure 1:
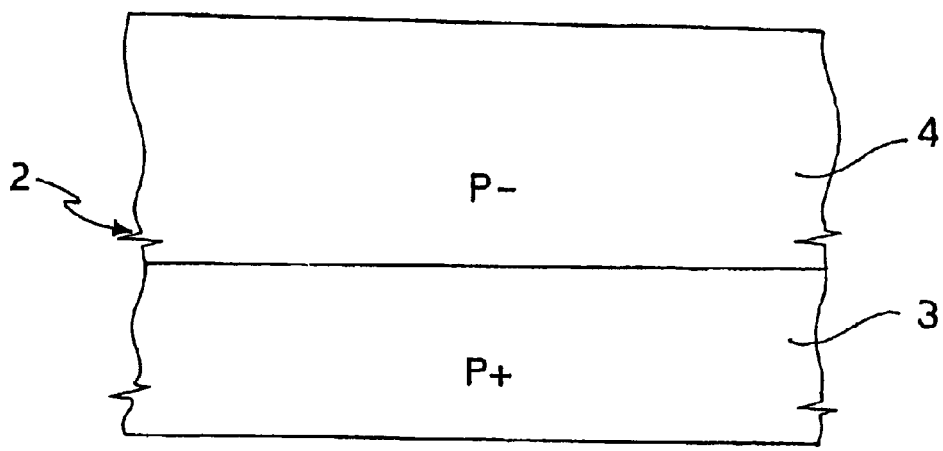
FIGS. 1 and 2 illustrate the initial steps of a particular method for manufacturing a transistor according to the invention.

According to the example in FIG. 1, the chip 2 is of the $P^+$–$P^-$ type, in other words of the type normally used for CMOS platform, and comprises a silicon substrate 3 of the $P^+$ type (i.e., highly doped) and a epitaxial layer 4 (in silicon) of the $P^-$ type, grown by means of conventional techniques.

The epitaxial layer 4 has conductivity of the same type as, but inferior to, the substrate 3. For example, in terms of resistivity, the silicon substrate 3 has a resistivity between 1 and 100 mΩ cm and a thickness between 10 $\mu$m and 1000 $\mu$m. According to a particular example, at the end of the production process, the thickness of the substrate 3 is 200

µm. The epitaxial layer 4 has, for example, resistivity between 1 and 100 Ω cm and a thickness, for example, between 1 and 10 µm.

Figure 2:
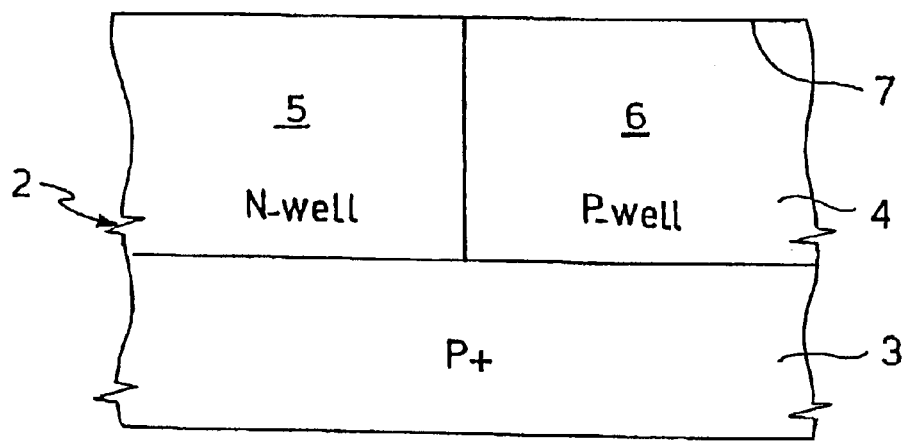

The epitaxial layer 4 is provided with (FIG. 2) a first doped well or region 5 and a second doped well or region 6 with a type of conductivity opposed to the first. For example, the first doped region 5 is a N-type region, i.e., a N-well region, and the second doped region 6 is a P-type region, i.e., a P-well region. The P-well and N-well regions can be obtained by means of conventional techniques which use a masking step, ionic implantation of the dopant and/or a diffusion step of said dopant. For example, the dose of dopant that can be used to obtain the N-well and P-well regions is between $1\ 10^{12}$ cm$^{-2}$ and $1\ 10^{14}$ cm$^{-2}$.

Later, on a surface 7 of the P-well and N-well regions, a layer of electrically insulated material is formed (e.g., an oxide, such as, preferably, silicon dioxide) with an uneven thickness. In particular, said oxide layer has a first portion with a first thickness $t_M$ and a second portion with a second thickness $t_m$, having a value distinct from that of the first thickness.

According to a preferential embodiment, said uneven oxide layer is formed by means of two successive oxide growth steps.

Figure 3:
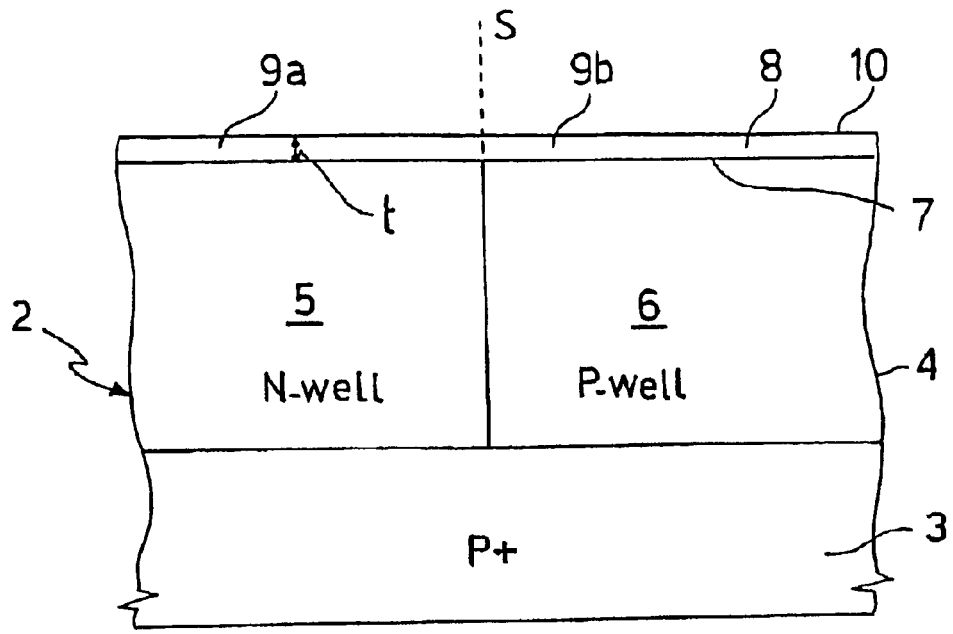
FIGS. 3 to 7 illustrate the manufacturing steps of a insulated gate electrode and an additional structure according to said method.
Figure 4:
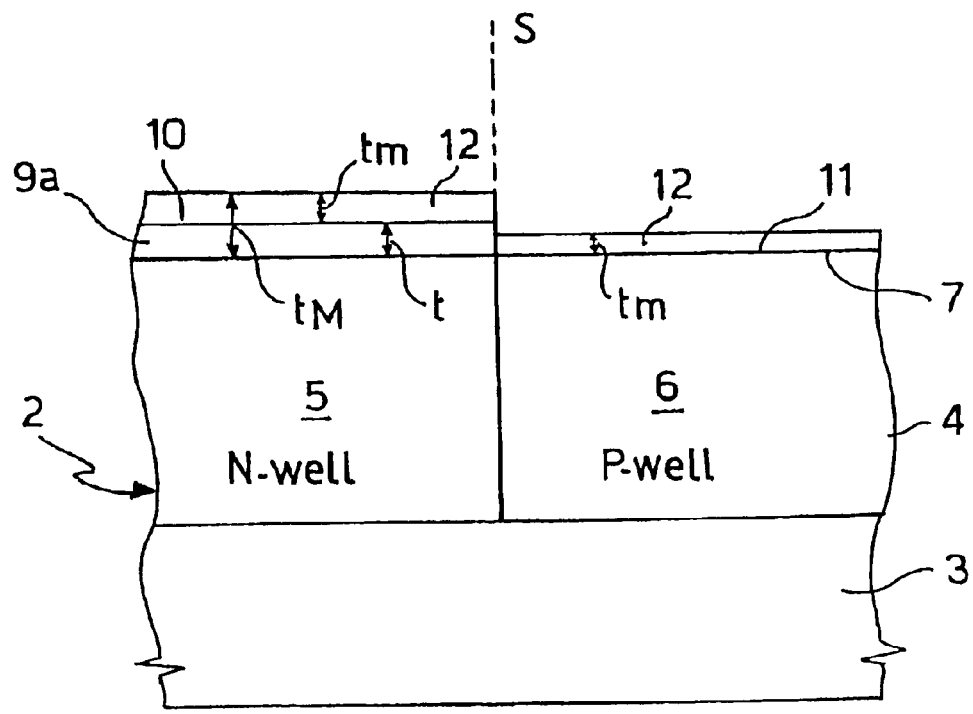

In this case, with reference to FIGS. 3 and 4, a first oxide layer 8 is grown on the surface 7, having a thickness t and with an intermediate value between the values $t_m$ and $t_M$ and, for example, equal to 160 A°.

Subsequently, an ideal surface S is defined in the layer 8, to separate the two portions of the oxide layer having different thicknesses. For example, but this is not a critical aspect of the proposed method, the surface S can substantially be the extension of the separating surface existing between the first N-well region 5 and the second P-well region 6. Said surface defines a first portion 9a and a second portion 9b of the oxide layer 8 which, substantially, are situated above the first N-well region 5 and the second P-well region 6 respectively.

Later, as illustrated in FIG. 4, the second portion 9b of the layer 8 is removed.

For example, said removal can be performed by means of a conventional photolithographic technique which comprises a photo-resist masking step and a selective chemical etching step.

In greater detail, the formation of the photo-resist mask comprises the use of a layer of photo-resist (not illustrated) arranged on a free surface 10 of the oxide layer 8 and partial irradiation of said photo-resist with electromagnetic waves (e.g., ultraviolet waves or X rays) passing through a suitable photo-mask (not illustrated). Irradiation of the photo-resist makes it possible to obtain polymerization of that portion of the photo-resist which is situated above the first portion 9a of the oxide layer 8 and which is not to be removed.

Following this, chemical etching is performed to remove the portion of photo-resist which is not polymerized and the underlying second portion 9b of the oxide layer 8 in such a way as to expose a surface 11 of the chip 2. Removal of the photo-resist is then completed.

Therefore, as illustrated in said FIG. 4, a further oxide layer 12 is grown on the surface 11 of the chip 2 and on the surface 10 of the first portion 9a This accretion step is carried out in such a way that the portion of the oxide layer 12 present on the surface 10 has a thickness equal approximately to $t_m$ and the portion of the layer 12 grown on the surface 11 is such that the layers 9a and 12 have a total thickness equal approximately to $t_M$.

Figure 5:
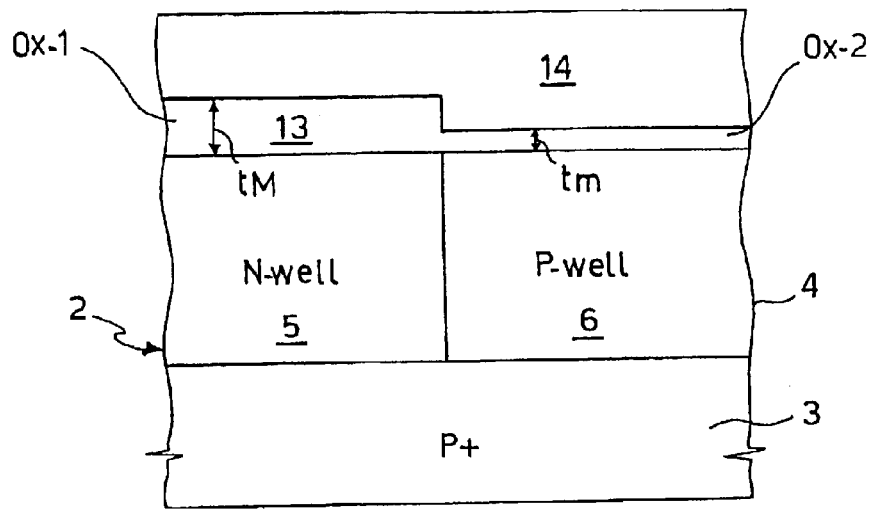

As illustrated schematically in FIG. 5, at the end of the above-mentioned step for the formation of the uneven oxide layer, this layer, generally indicated in 13, comprises a first oxide portion Ox-1, with thickness $t_M$, and a second oxide portion Ox-2, with thickness $t_m$.

In particular, the thickness $t_M$ of the first portion Ox-1 is greater than the thickness $t_m$ of the second portion Ox-2.

For example, the thickness $t_M$ is between 20 A° and 500 A° and the thickness $t_m$ is between 10 and 250 A°.

Preferably, for radio frequency power applications, the thickness $t_M$ is between 100 A° and 300 A° and the thickness $t_m$ is between 25 and 150 A°.

According to a particular example of the above-described method, the thickness $t_M$ is equal approximately to 180 A° and the thickness $t_m$ is equal approximately to 70 A°.

Later, as illustrated in FIG. 5, a layer of electrically conductive material 14 is deposited above the oxide layer 13, preferably polysilicon, suitably doped to make it conductive. A portion of this polysilicon layer 14 is to form the gate polysilicon of the MOS transistor.

Subsequently a photo-resist masking layer 15 or, more briefly, a photo-resist mask (FIG. 6) is formed above the polysilicon layer 14.

Figure 6:
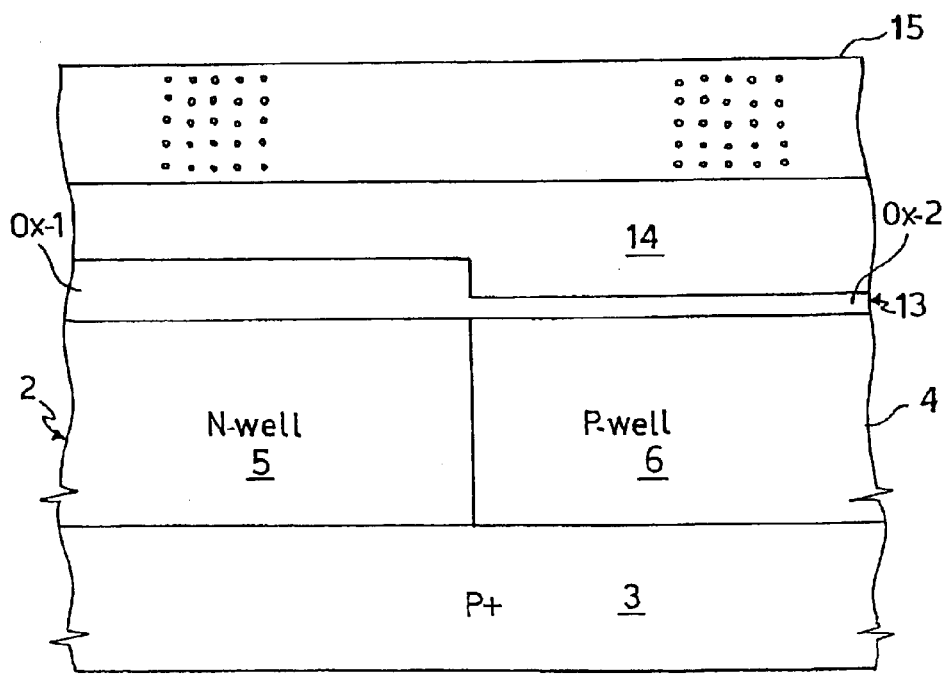

As is evident for the skilled-in-the-art, this photo-resist mask 15 is obtained by a photo-resist layer deposited on a polysilicon layer 14 and suitably irradiated with electromagnetic waves which pass through a suitable photo-mask (not illustrated) in such a way as to cause polymerization of some of its portions (represented in FIG. 6 by small circles).

Based on said photo-resist mask 15, selective etching is carried out, for example, according to conventional techniques, on the polysilicon layer 14 so as to remove that portion of polysilicon and of the underlying oxide layer 13 not covered by the polymerized portions of the mask 15.

Figure 7:
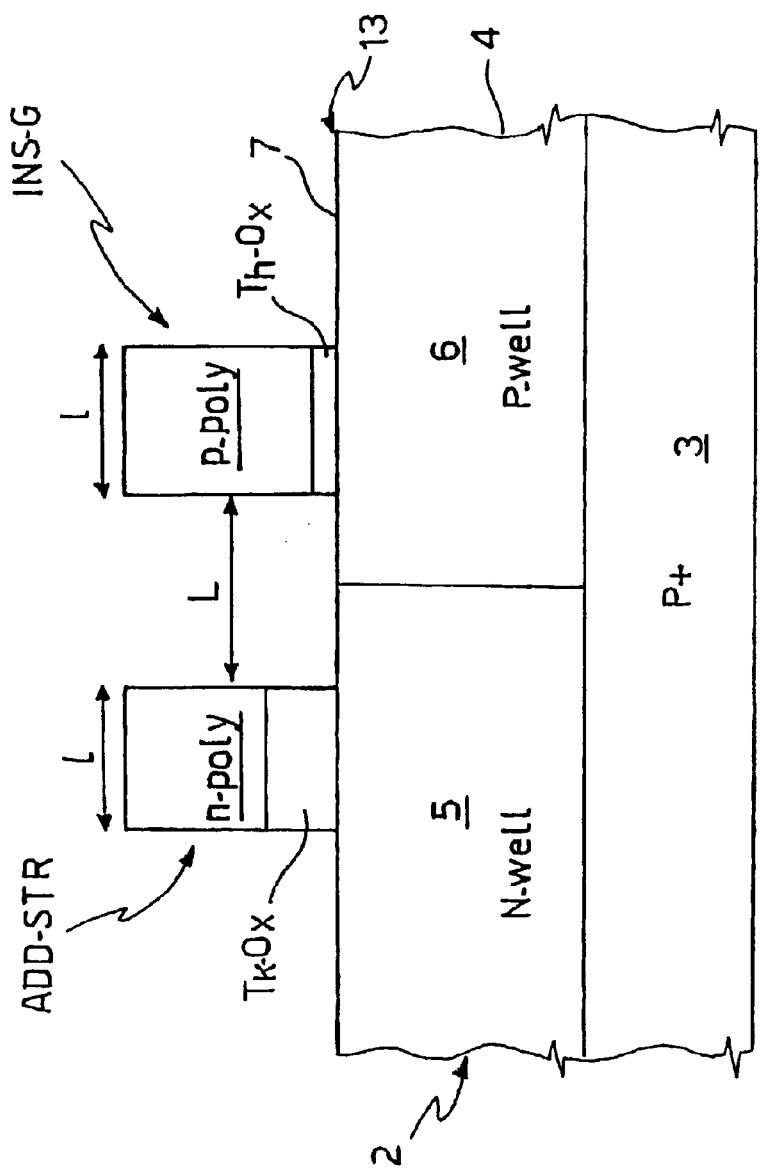

As illustrated in FIG. 7, the masking and etching steps make it possible to define, starting from the insulating 13 and conductive 14 layers, an insulated electrode of gate INS-G and an additional structure ADD-STR (hereinafter also called additional insulated electrode).

The additional structure ADD-STR is arranged on a portion of the N-well and comprises a first layer of oxide Tk-Ox (with thickness $t_M$) and, above this, a first layer of polysilicon, indicated in the figure with the reference "n-poly" to express the fact that it is situated above the N-well 5.

The insulated gate electrode INS-G comprises a second layer Th-Ox (with thickness $t_m$) and, above this, a second layer of polysilicon, indicated in the figure with the reference "p-poly" to express the fact that it is situated above the P-well 6.

For example, the first and second polysilicon layers, n-poly and p-poly, have equal widths I and, in particular, equal to 0.35 µm and the distance L between these two polysilicon elements is 0.4 µm. It must be considered that the above-mentioned values of width I and distance L are given purely as examples and the skilled-in-the-art can, according to the invention, choose different values, preferably smaller than these, according to the possibilities offered by the photolithographic technology available. For example, the first n-poly and second p-poly polysilicon layers have equal thicknesses of a value equal to that normally used in conventional CMOS technology.

It should be noted that, advantageously, the above-described method, which led to the manufacture of the insulated gate electrode ANS-G and the additional structure ADD-STR, is fully compatible with the CMOS technology. In other words, as will be noted by the skilled in the art, the above-described manufacturing steps can be integrated, without substantial changes, into a process for manufacturing CMOS devices used in other parts of the same chip 2. In fact, as emerges from the above description, the additional structure ADD-STR can be made in steps carried out simultaneously with steps for manufacturing insulated gate electrodes and does not require additional masking and etching processes.

Figure 8:
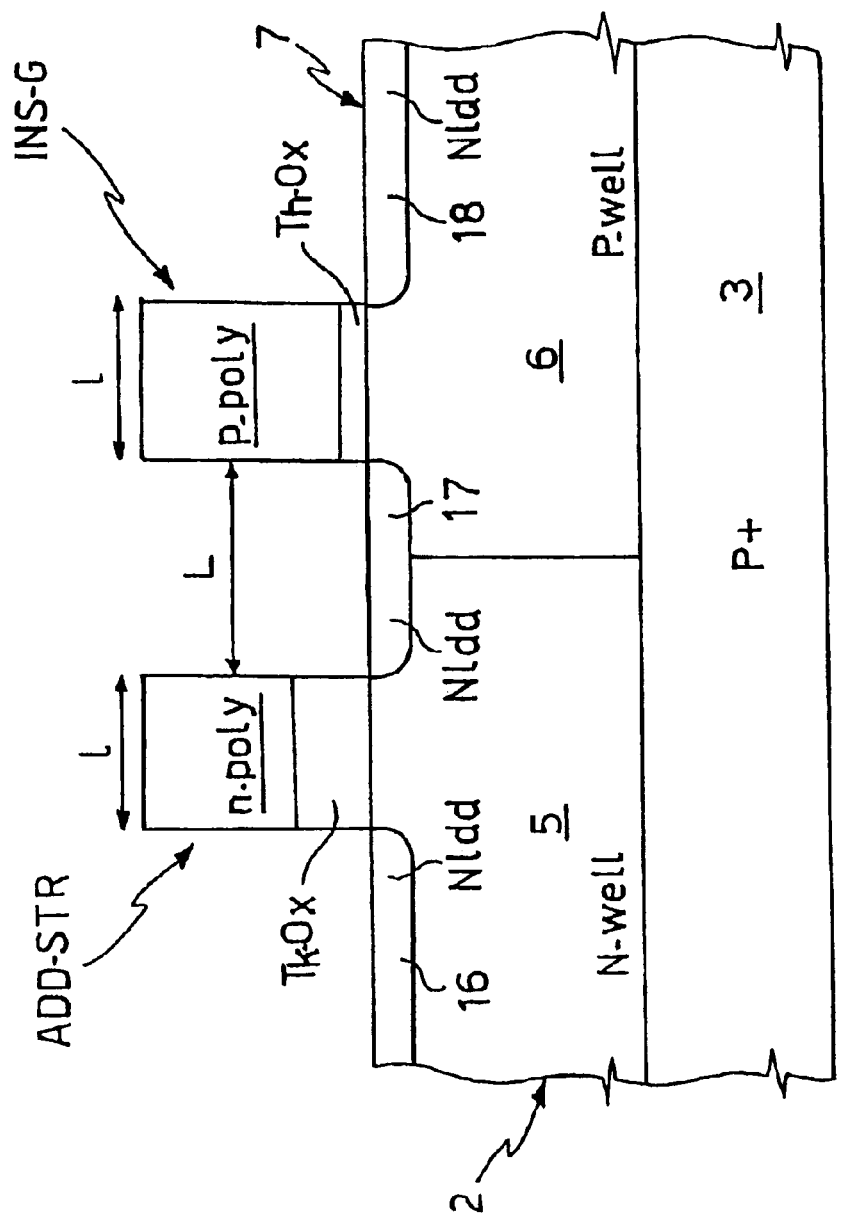
FIG. 8 illustrates said transistor including lightly doped regions.

Later, as illustrated in FIG. 8, a first and a second drain region 16 and 17, lightly doped, and a source region 18, lightly doped, are placed on the chip 2. Said lightly doped regions 16, 17, 18, extend from the inside of the chip 2 to the surface 7 of said chip and, according to the example, are of the N type. Said lightly doped three regions are also indicated in FIG. 8 with the conventional Nldd ("lightly doped drain"). For example, the dose of dopant to be used for said Nldd regions is between $1\ 10^{12}\ cm^{-2}$ and $1\ 10^{14}\ cm^{-2}$.

The lightly doped source region 18 and the second lightly doped drain region 17 are near the insulated gate electrode INS-G and extend along the sides opposite said electrode.

The lightly doped drain and source regions 16, 17 and 18 can be formed by means of a conventional technique of ionic implantation which provides irradiation of the free surface of the chip 2 with a beam of ions through a suitable photo-mask and a successive diffusion step. The three lightly doped regions 16, 17 and 18 can be obtained with a single ionic implantation process or several implantations which use different photo-masks and make it possible to obtain the three regions with different dopants.

The inventive method continues with the formation of a central dielectric spacer C-SP placed between the insulated gate electrode INS-G and the additional structure ADD-STR and the formation of a first and a second lateral dielectric spacer S1 and S4.

Figure 9:
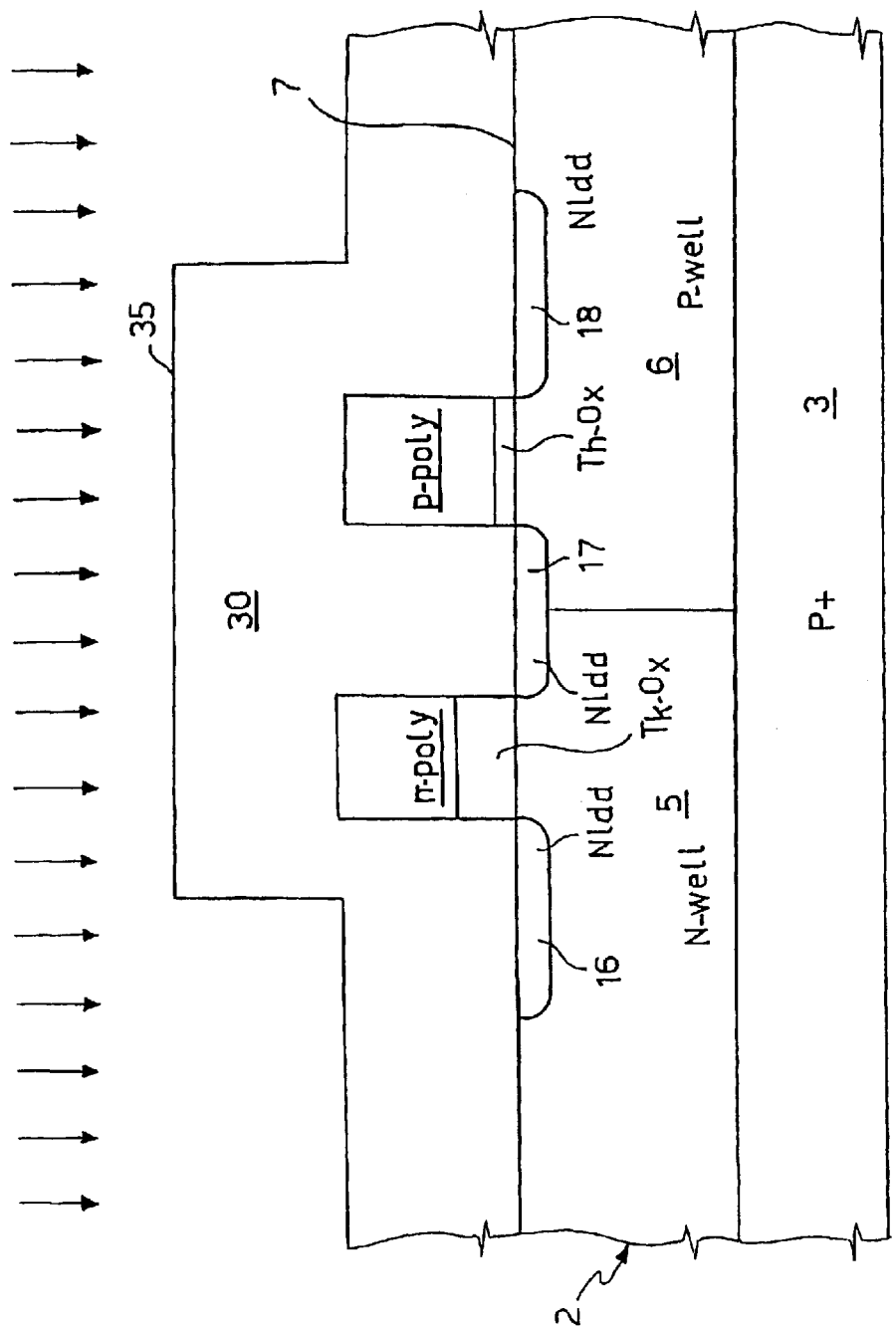
FIGS. 9 and 10 illustrate the manufacturing steps of dielectric spacers according to said method.

The dielectric spacers S1, S4 and C-SP can be obtained using techniques usually used to obtain lateral spacers in the manufacture of MOS transistors. In greater detail and with reference to FIG. 9, a layer of dielectric material 30 is deposited on the integrated structure shown in the previous FIG. 8, in such a way that it completely fills the space between the additional structure ADD-STR and the insulated gate electrode INS-G.

The layer 30 is composed of a suitable insulating material such as, for example, silicon oxide or, preferably, silicon nitride.

The layer of dielectric material 30 can be deposited by means of CVD (Chemical Vapor Deposition).

After the deposition step, a dry etching step is carried out to remove suitable portions of the dielectric layer 30 and, in particular, to remove those portions situated above the first n-poly and the second p-poly layer in polysilicon so as to expose respective free surfaces of said layers.

Figure 10:
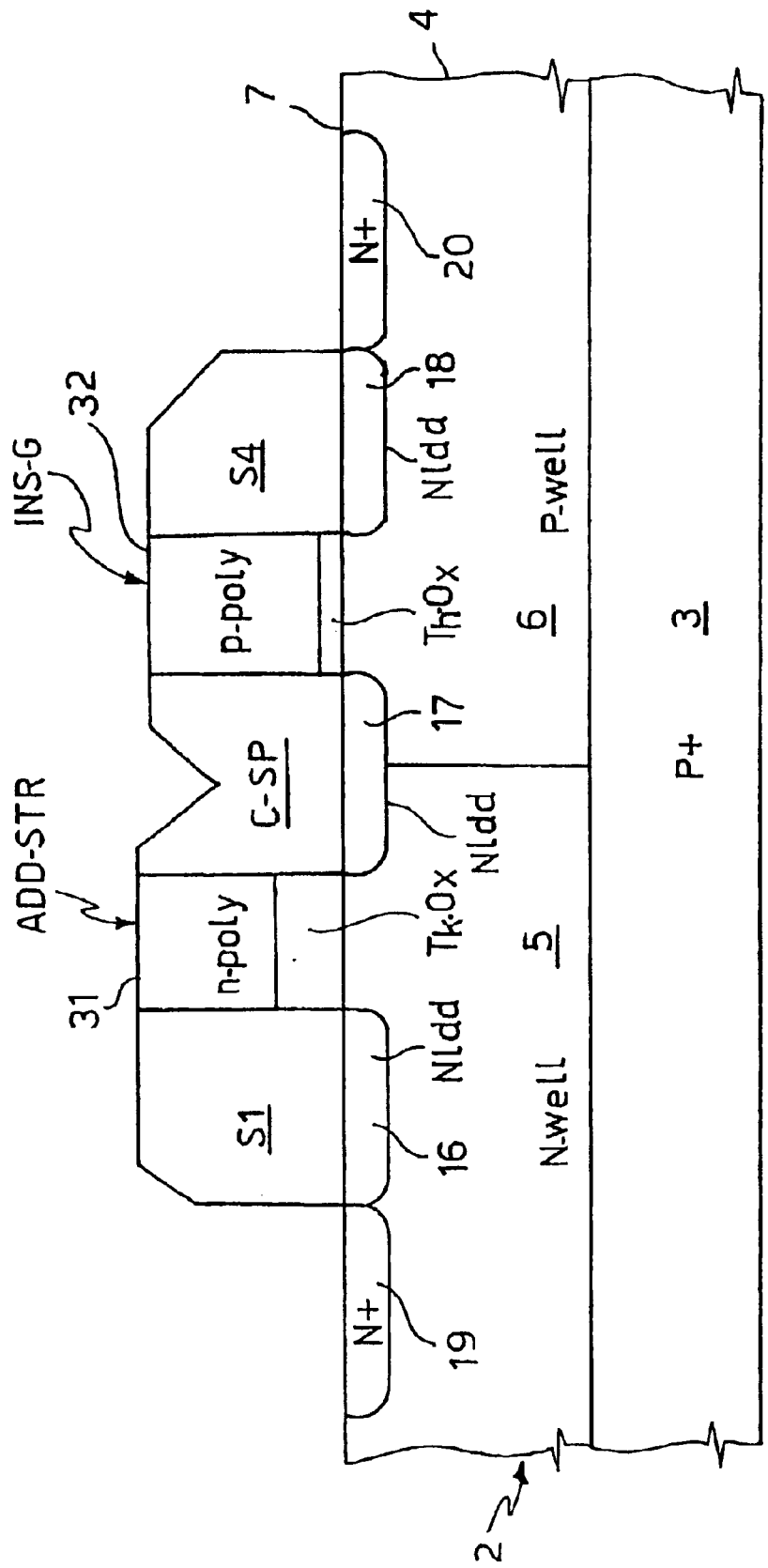

The dry etching is of the anisotropic type and envisages irradiation of a surface 35 of the layer 30 opposite the layer 7 of the chip 2 with a suitable beam of ions and for an adequate length of time and such as to expose the upper free surfaces 31 and 32 of the first n-poly and second p-poly polysilicon layers and to form the central dielectric spacer C-SO and the lateral spacers S1 and S4 (FIG. 10). It should be noted that the etching process of the insulating material 30 is, in itself, similar to that used in conventional CMOS technology only for the formation of conventional lateral spacers.

In particular, the thickness of the dielectric layer 30, the method used for the dry etching process and the value of the above-defined distance L are such that the portion of the dielectric layer 30 between the insulated gate electrode ING-S and the additional structure ADD-STR is not completely removed and, therefore, that the remaining portion forms the central dielectric spacer C-SP. A similar observation is valid for the formation of the lateral spacers S1 and S4.

It should be observed that the way in which the central spacer C-SP and the lateral spacers S1 and S4 are formed can easily be determined by the skilled-in-the-art on the basis of the previous description.

Furthermore, it should be noted that formation of said spacers C-SP, S1 and S4 by means of the above described method is particularly advantageous because it exposes the free surface 32 of the second polysilicon layer p-poly, in such a way that no portions of the layer 30 remain deposited on the second polysilicon layer.

As illustrated in FIG. 10, the central dielectric spacer C-SP is situated above the second lightly doped drain region 17. Furthermore, the first lateral spacer S1 is situated above the first lightly doped drain region 16 and the second lateral spacer S4 is situated above the lightly doped source region 18.

After the formation of said spacers, a highly doped drain region 19 (of the $N^+$ type) and a highly doped source region 20 (of the $N^+$ type) are formed on opposite sides of the two lateral spacers S1 and S4.

Said highly doped drain 19 and source 20 regions can be formed by means of conventional techniques which envisage ionic implantation. The presence of the central spacer C-SP and the first and second lateral spacers S1 and S4 make it possible to screen, during implantation step, the first and second lightly doped drain regions 16, 17 and the lightly doped source region 18 and to obtain the desired alignment with the implanted highly doped regions 19 and 20.

Furthermore, it should be noted that the three spacers S1, S4, and C-SP are particularly advantageous because, thanks to their screening action, they permit implantation of the drain regions $N^+$, 19, and the source regions $N^+$, 20, without doping the three lightly doped regions 16, 17 and 18.

It should be noted that the presence of lightly doped regions (i.e., with reduced conductivity), such as said three Nldd regions, makes it possible to increase the breakdown voltage, in other words to increase the maximum voltage supported by the transistor.

The highly doped drain 19 and source 20 regions have, for example, doping values between $10^{19}$–$10^{20}$ ions/cm$^3$.

With reference to FIG. 11, the method envisages a silicide application step, i.e., the formation of silicide layers on suitable portions of the surface of the chip 2.

In particular, surface layers of silicide 21 and 22 are deposited on the drain regions $N^+$, 19, and the source regions $N^+$, 22 respectively, and surface layers of silicide 23 and 24 on the first polysilicon layer n-poly and the second polysilicon layer p-poly respectively.

Advantageously, the silicide application step is performed by means of the conventional "salicidation" method (self-aligned silicide) which permits formation of silicide layers aligned with the underlying polysilicon or silicon regions. For example, the surface layers 21, 22 and 23 can be in titanium silicide ($TiSi_2$) or cobalt silicide ($CoSi_2$).

For example, the formation of the silicide layers 21, 22, 23 and 24 is performed by means of depositing (e.g., by means of spraying or sputtering) a thin layer of a refractory metal layer on the surface of the chip 2, and in particular above the source and drain regions N+, 20, and on the free surfaces 31 and 32 of the polysilicon n-poly and p-poly elements.

Later, the chip 2 undergoes a heat treatment which causes a chemical reaction between the metal deposited and the surface areas of the underlying silicon, leading to the formation of the four silicide regions 21, 22, 23, 24.

According to a different embodiment of the method of this invention, tungsten can be used, $WSi_2$, for the application of silicide to the two polysilicon layers n-poly and p-poly, deposited after formation of the polysilicon layer 14 in FIG. 5, and defined with the same masks which define said layers of polysilicon, n-poly and p-poly.

As far as salicidation is concerned, during the metal sputtering step (e.g., cobalt or titanium), the central dielectric spacer C-SP screens and protects the second lightly doped drain region 17. Similarly, the first and second lateral spacers S1 and S4 protect the first lightly doped drain region 19 and the lightly doped source region 20 respectively.

With reference to salicidation, it should be noted that during the sputtering step, a mask to prevent the metal from depositing on the free surfaces of said three lateral spacers S1, S4 and C-SP is not necessarily required.

In fact, forming said lateral spacers in silicon dioxide or in nitride, the chemical reaction between the deposited metal and the underlying material which leads to the formation of silicide does not take place during the subsequent heating step.

Furthermore, it should be noted that the free surface 32 of the second polysilicon layer p-poly, being completely exposed, is completely covered with the metal and, therefore, it is possible to obtain a substantially complete salicidation of the surface area of the insulated gate electrode INS-G.

The substantially complete salicidation of the free surface 32 and of the surface portions of the highly doped source and drain regions 19 and 20 is particularly advantageous since it permits reduction of the input and output surface resistivity of the transistor and, therefore, an increase in the speed and trans-conductance, to which gain is correlated, of said transistor. Note that this substantially complete salicidation takes place thanks to the screening action of the central spacer C-SP, so as to protect the lightly doped region 17. In the same way, the lateral spacers S1 and S4 screen the lightly doped regions 16 and 18.

The fact that the three lightly doped regions 16, 17 and 18 have not undergone silicidation makes it possible to increase the breakdown voltage, BV.

The method can also comprise a conventional step for forming highly doped contact regions to contact the highly doped drain 19 and source 20 regions.

The above-described method leads to the formation of the transistor 100, schematically illustrated in FIG. 12, comprising an active drain region D-REG including the highly doped region 19, the first and second lightly doped regions 16 and 17 and portions of the N-well, and an active source region S-REG including the highly doped region 20 and the lightly doped region 18. The central dielectric spacer C-SP electrically insulates the insulated gate electrode INS-G from the additional structure ADD-STR.

Furthermore, the transistor 100 is provided with suitable metallization (obtainable with conventional techniques), among which those of drain, source and gate illustrated in FIG. 12 with three electric terminals D, S and G.

When the MOS transistor 100 acts as an amplifier, the gate electric terminal G can constitute the input terminal of the signal to be amplified and an electric voltage $V_D$ (for example equal to 5V), having a greater amplitude than the voltage $V_S$ applied to the source terminal S (normally grounded), is applied to the drain terminal D: absolute value of $V_D$ is greater than the absolute value of $V_S$.

The first polysilicon layer n-poly of the additional structure ADD-STR, which constitutes an additional insulated electrode, could be left floating but, preferably, to it a voltage is applied having a value such as to enable said additional insulated electrode ADD-STR to generate a voltage or electric potential such as to reduce the surface electric field of the drain region D-REG.

This reduction in the electric field is particularly convenient because it is possible to withstand relatively high working voltages $V_{DS}$ and, therefore, to increase the breakdown voltage between the source and drain regions, BVds.

In particular, the same source voltage $V_S$ is applied to the first polysilicon layer n-poly which, as said before, is lower than the drain voltage $V_D$. For this purpose, additional metallization is advantageously envisaged, schematically illustrated in FIG. 12 with an electric connection ADD-MT, which extends from the source terminal S to the first polysilicon layer n-poly of the additional structure ADD-STR.

The distribution of the electric field and the voltage lines in an integrated structure similar to the one described above was analyzed by means of computer simulation. This analysis simulated a working situation in saturation condition ($V_{DS}$=8V; $V_{GS}$=3.3V) and a working situation near breakdown ($V_{DS}$=13.5V; $V_{GS}$=0). During simulation, a source region S-REG connected electrically to the n-poly was considered.

First of all, a considerable increase in the breakdown voltage $BV_{ds}$ was noted (up to approximately 13.5 V) compared to that obtainable with conventional MOS transistors and equal, for example, to 8V.

This demonstrates how the structure can be used for high-power applications (e.g., for power equal to 2 W, or higher) and/or high working voltage, maintaining the satisfactory high frequency performance of the conventional structures obtained with CMOS technology.

Furthermore, the simulations demonstrated that the highest amplitude values of the electric field and the voltages are to be found, for both operating conditions taken into consideration, substantially in an area A (indicated with a circle in FIG. 12) of the lightly doped drain region 16 and the N-well region situated near the additional insulated electrode ADD-STR. Advantageously, it is exactly in said area A that the above-described effect of reduction in the electric field takes place. With the aim to increase said reduction action carried out by the additional electrode ADD-STR, it is advantageous to carry out additional metallization ADD-MT in such a way that this, insulated by means of a relative layer of oxide, extends above the central spacer C-SP and, if necessary, above the surface of the drain region D-REG.

FIG. 13 illustrates, in more detail than FIG. 12, a source metal contact CONT-S directly connected to the additional metallization ADD-MT which extends, separated by an oxide layer OX, to the central spacer C-SP to make contact with the first polysilicon layer n-poly (said contact illustrated schematically by dashed lines in the cross-section in FIG. 13). FIG. 13 also illustrates a drain contact CONT-D and the drain metallization MT-D.

A further advantage is represented by the fact that the first oxide layer Tk-Ox is present near said region A but with a greater thickness and is therefore more suitable than the second oxide layer Th-Ox to withstand high electric fields. The presence of the thicker first oxide layer Tk-Ox placed in a suitable position (in other words near the active region with greater voltage) is, therefore, a solution which contributes to the increase in the breakdown voltage.

A further advantage consists in the fact that it is particularly reliable when compared to conventional MOS transistors, regarding the undesirable phenomenon of the injection of hot carriers into the gate oxide. In fact, in the transistor 100 it is more probable that this phenomenon occurs near area A, where the electric field is higher, and causes an injection of carriers into the first oxide layer Tk-Ox. Such an event would cause less damage, for the operation of the transistor 100, than a less probable injection of carriers into the second oxide layer Th-Ox belonging to the insulated gate electrode INS-G to which the control signal of the transistor 100 is applied.

It is to be noted also that the thickness of the second oxide layer Th-Ox can be chosen independently of that of the first oxide layer Tk-Ox. In particular, the thickness of the second oxide layer can be chosen with a suitably low value to satisfy those requirements of the transistor not directly connected to the breakdown voltage such as, for example, a high transconductance.

Another important advantage is connected to the fact that the method described is, as mentioned above, compatible with standard CMOS technology. In particular, the method makes it possible to obtain the insulated gate electrode INS-G with the minimum width size I possible with the technology available. Reducing the width I of the polysilicon layer p-poly of the insulated gate electrode INS-G to the minimum possible, permits reduction in the input capacity of the transistor and, therefore, an increase in its radio frequency performance.

It is to be noted that the teachings of this invention are applicable, in a way obvious to the skilled-in-the-art on the basis of the above description, not only to N-channel transistors but also to P-channel transistors.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Obviously, in order to satisfy contingent and specific requirements, the skilled-in-the-art can make further modifications and variations to the method and transistors according to this invention, all falling within the protection scope of this invention, as defined in the following claims.

What is claimed is:

1. A MOS transistor integrated into a chip of semiconductive material, comprising:
   first, second, and third doped regions which extend from inside the chip to a surface of the chip;
   a first insulated gate electrode placed on the surface of the chip, between the first and second doped regions;
   a second insulated gate electrode placed on a first surface portion of the surface of the chip, between the first insulated gate electrode and the third doped region;
   a dielectric spacer placed between said first and second insulated gate electrodes and situated above a second surface portion of the surface of the chip; and
   a conductive layer connecting the third doped region to the first insulated gate electrode.

2. A transistor according to claim 1, further comprising first and second well regions formed in the chip, the first well region having a first conductivity type and the second well region having a second conductivity type, and the first insulated gate electrode being positioned directly above the first well region and the second insulated gate electrode being positioned directly above the second well region.

3. A transistor according to claim 2, wherein the first doped region is formed in the first well region, the third doped region is formed in the second well region, and the second doped region is formed in both of the first and second well regions.

4. A transistor according to claim 3, wherein the first, second, and third doped regions are all of the first conductivity type.

5. A transistor according to claim 1, wherein said second insulated gate electrode includes a first insulating layer and a first conductive layer and said first insulated gate electrode includes a second insulating layer and a second conductive layer, wherein said first insulating layer has a thickness greater than a thickness of the second insulating layer.

6. A transistor according to claim 5, wherein the first and the second doped regions comprise respective first silicide surface layers that are drain and source terminals of the transistor, and said first and second conductive layers comprise respective second silicide surface layers.

7. A transistor according to claim 1, wherein the first doped region comprises a highly doped portion and a lightly doped portion, said first surface portion on which the second insulated gate electrode is placed having a conductivity inferior to that of said highly doped portion and said dielectric spacer overlaying the lightly doped portion.

8. A transistor according to claim 7, further comprising a first lateral spacer adjacent to said second insulated gate electrode and such as to overlay the lightly doped portion of the first doped region, and a second lateral spacer adjacent to said first insulated gate electrode such as to overlay a lightly doped portion of said third doped region.

9. A transistor according to claim 8, wherein said dielectric spacer and said first and second lateral spacers are composed of silicon dioxide or silicon nitride.

10. An integrated MOS transistor, comprising:
    first and second well regions positioned adjacent to each other in a semiconductor substrate, the first well region having a first conductivity type and the second well region having a second conductivity type;
    first, second, and third doped region formed in surface portions of the first and second well regions, the first, second, and third doped regions having the first conductivity type;
    a first insulated gate electrode placed on a surface of the substrate, directly above the first well region and between the first and second doped regions;
    a second insulated electrode placed on the surface of the substrate, directly above the second well region and between the second and third doped regions; and
    a dielectric spacer positioned between the first and second insulated gate electrodes.

11. The transistor of claim 10, further comprising a conductive layer connecting the third doped region to the first insulated gate electrode.

12. The transistor of claim 10 wherein the first doped region is formed in the first well region, the third doped region is formed in the second well region, and the second doped region is formed in both of the first and second well regions.

13. The transistor of claim 10 wherein the second insulated gate electrode includes a first insulating layer and a first conductive layer and the first insulated gate electrode includes a second insulating layer and a second conductive layer, wherein the first insulating layer has a thickness greater than a thickness of the second insulating layer.

14. The transistor of claim 13 wherein the first and the second doped regions comprise respective first silicide surface layers that are drain and source terminals of the transistor, and the first and second conductive layers comprise respective second silicide surface layers.

15. The transistor of claim 10 wherein the first doped region comprises a highly doped portion and a lightly doped portion, and the first surface portion on which the second insulated gate electrode is placed has a conductivity inferior to that of the highly doped portion.

16. The transistor of claim 15, further comprising a first lateral spacer adjacent to the second insulated gate electrode and overlaying the lightly doped portion of the first doped region, and a second lateral spacer adjacent to the first insulated gate electrode and overlaying a lightly doped portion of the third doped region.

17. The transistor of claim 10 wherein the dielectric spacer extends completely from the first insulating gate electrode to the second insulating gate electrode.

18. An integrated MOS transistor, comprising:
   first and second well regions positioned immediately adjacent to each other in a semiconductor substrate, the first well region having a first conductivity type and the second well region having a second conductivity type;
   a first doped region formed in the first well region and having the first conductivity type;
   a second doped region formed in the second well region and having the first conductivity type;
   a third doped region formed in the first and second well regions and having the first conductivity type;
   a first insulated gate electrode placed on a surface of the substrate, directly above the second well region and between the second and third doped regions; and
   a first dielectric spacer positioned above the third doped region.

19. The transistor of claim 18, further comprising:
   a second insulated electrode placed on the surface of the substrate, directly above the second well region and between the first and third doped regions; and
   a conductive layer positioned above the first insulated gate electrode and connecting the second doped region to the second insulated gate electrode.

20. The transistor of claim 19 wherein the first insulated gate electrode includes a first insulating layer and a first conductive layer and the second insulated gate electrode includes a second insulating layer and a second conductive layer, wherein the first insulating layer has a thickness less than a thickness of the second insulating layer.

21. The transistor of claim 19 wherein the first dielectric spacer extends completely from the first insulating gate electrode to the second insulating gate electrode.

22. The transistor of claim 18 wherein the first and the second doped regions comprise respective first silicide surface Layers that are drain and source terminals of the transistor, and the first and second conductive layers comprise respective second silicide surface layers.

23. The transistor of claim 18 wherein the first doped region comprises a highly doped portion and a lightly doped portion, the lightly doped portion being positioned between the highly doped portion and a channel portion of the first well region between the lightly doped portion and the third doped region.

24. The transistor of claim 23 wherein the second doped region comprises a highly doped portion and a lightly doped portion, and the third doped region is lightly doped, the lightly doped portion of the second doped region being positioned between the highly doped portion of the second doped region and a channel portion of the second well region between the lightly doped portion of the second doped region and the third doped region.

25. The transistor of claim 24 wherein second and third dielectric spacers are positioned directly above the lightly doped portions of the first and second doped regions, respectively, the transistor further comprising suicide layers formed on the highly doped portions and on the first insulated gate electrode.

* * * * *

UNITED STATES PATENT AND TRADEMARK OFFICE
CERTIFICATE OF CORRECTION

PATENT NO.    : 6,911,699 B2
DATED         : June 28, 2005
INVENTOR(S)   : Alessandro Moscatelli et al.

It is certified that error appears in the above-identified patent and that said Letters Patent is hereby corrected as shown below:

Column 12,
Line 18, "Layers" should read -- layers --.
Line 38, "suicide" should read -- silicide --.

Signed and Sealed this

Twenty-fourth Day of January, 2006

JON W. DUDAS
*Director of the United States Patent and Trademark Office*